United States Patent [19]

Zimmerman et al.

[11] Patent Number: 4,752,750
[45] Date of Patent: Jun. 21, 1988

[54] HYBRID PROGRAMMABLE TRANSVERSAL FILTER

[75] Inventors: Dale E. Zimmerman, Dallas; Carl M. Panasik, Garland, both of Tex.

[73] Assignee: Texas Instruments Incorporated, Dallas, Tex.

[21] Appl. No.: 869,145

[22] Filed: May 30, 1986

[51] Int. Cl.$^4$ .................... H03H 9/64; H03H 15/00
[52] U.S. Cl. .................................. 333/166; 333/193; 333/196
[58] Field of Search ................. 333/150–155, 333/193–196, 166; 310/313 R, 313 A, 313 B, 313 C, 313 D; 364/821

[56] References Cited

U.S. PATENT DOCUMENTS

| | | | |
|---|---|---|---|
| 4,207,546 | 6/1980 | Grudkowski | 333/152 |
| 4,328,473 | 5/1982 | Montress et al. | 333/166 X |
| 4,665,374 | 5/1987 | Fathimulla | 364/821 X |

Primary Examiner—Marvin L. Nussbaum
Attorney, Agent, or Firm—Carlton H. Hoel; Leo N. Heiting; Melvin Sharp

[57] ABSTRACT

A hybrid programmable transversal filter (HPTF) is described that employs a LiNbO$_3$ SAW delay line and two monolithic dual-gate GaAs FET arrays to control magnitude and sign of the 16 tap weights. The HPTF is completely programmable and is constrained only by the bandwidth (100 MHz centered at 250 MHz) and the number of taps. Theoretical calculations of tap weight control range and dynamic range are presented, compared with experiment and used to justify the hybrid LiNbO$_3$ SAW - GaAs FET combination. Dynamic range of 85 dB and a continuously variable tap weight control range of 70 dB are demonstrated.

4 Claims, 6 Drawing Sheets

HYBRID PROGRAMMABLE TRANSVERSAL FILTER

STATEMENT AS TO RIGHTS TO INVENTIONS MADE UNDER FEDERALLY SPONSORED RESEARCH AND DEVELOPMENT

The U.S. Government has a paid-up license in this invention and the right in limited circumstances to require the patent owner to license others on reasonable terms as provided for by the terms of Contract No. F33615-82-C-1859 awarded by the U.S. Air Force.

BACKGROUND OF THE INVENTION

1. Field of the Invention

The present invention relates to semiconductor electronic devices, and, more particularly, to transversal filters.

2. Description of the Related Art

Aircraft operational requirements for communications, navigation, and identification equipment have been increasing continuously and have resulted in a proliferation of complex and expensive equipment to do each specific function. The diversity of signal characteristics applied in communications, navigation, and identification presents a formidable array of challenges in the design of signal processors. Therefore, the challenge is to develop high performance, efficient, programmable front end processors that are applicable in a wide variety of systems. In particular, programmability of the filter function is the basis for integrating several communications functions into a single device; without programmability, integration would consist only of making everything smaller, not of combining functions, and flexibility for adapting to changes in requirements and waveforms would be lost.

Transversal filters tap (detect) an input signal at various places along the signal's path and output a weighted sum of the tap signals; thus a transversal filter is ideally a process of shift, multiply and sum. Transversal filters find use in various communication functions; and if the weights multiplying the tap signals can be programmed, then such filters could be used, for example, in programmable communications receivers and adaptive signal processing for spread-spectrum systems. Indeed, the programmable transversal filter (PTF) is an extremely versatile wideband signal processor. This single device can operate as a bandpass, band-reject, adaptable or matched filter.

Surface acoustic wave (SAW) devices are well suited for carrying the input signal in a PTF because the acoustic signal can be sensed at locations along the propagation path by a series of taps that minimally degrade the acoustic signal. The SAW device provides a tapped delay line for the input signal. The tap weights can be electronically programmed by use of dual-gate MOS field effect transistors for the tapping and weighting functions: one gate is connected to the tap and the other gate is connected to the tap weight control, the outputs are tied together for the summing function. See, S. Kwan et al, Dual-Gate Depletion-Mode DMOS Transistor for Linear Gain-Control Application, 26 IEEE Tran. Elec. Dev. 1053 (1979), which describes a monolithic programmable transversal filter (PTF) fabricated on a silicon substrate with a rectangular ZnO thin film acting as the SAW device, the input signals are converted to acoustic signals by a wide-band interdigitated input transducer on the ZnO, the taps are a series of electrodes across the ZnO with each electrode end connected to a first gate of a dual-gate depletion-mode common-source configured silicon MOSFET adjacent the ZnO, the second gates of the MOSFETs are connected to external tap weight controls, and the drains of all of the MOSFETs on one side of the ZnO are tied together to the inverting input of a differential output amplifier in the silicon and the drains of all of the MOSFETs on the other side of the ZnO are tied to the noninverting input of the differential amplifier. This provides a differencing scheme and linear dependence of the MOSFET gain on the tap weight control voltage.

Several other PTFs using SAW devices have been reported in the literature. Recently a SAW/FET (LiNbO$_3$ SAW with silicon MOSFETs and air-gap coupled) approach demonstrated 50 MHz of bandwidth centered at 150 MHz. However, tap control range was limited to 16 dB and single tap insertion loss was 80 dB; see, D. Oates et al, Wide-Band SAW/FET Programmable Transversal Filter, Proc. IEEE Ultrasonics Symp. 312 (1984). A monolithic GaAs approach in which the SAW and the FETs are implemented on the same GaAs substrate has demonstrated 58 dB dynamic range at 500 MHz over a 50 MHz bandwidth (10%); see, J. Duquesnoy et al, A Monolithic 7 Tap-Programmable Transversal Filter on Gallium Arsenide, Proc. IEEE Ultrasonics Symp. 303 (1984). As noted by the authors, "no good programmable device has reached the industrial level so far, despite all the work done in that field for the last 15 years."

A variety of other approaches to programmable filters have been developed, but fail to overcome the problems of the known programmable transversal filters such as limited dynamic range (100 dB in a 1 MHz bandwidth seems necessary for general applications). These other approaches include: (1) A GaAS CCD delay line with fixed tap weights, the filter's center frequency is programmed by the clock frequency; see, I. Deyhimy et al, GaAs and Related Heterojunction Charge-Coupled Devices, 27 IEEE Tran. Elec. Dev. 1172 (1980) and W. Hill et al, 1 GHZ Sample Rate GaAs CCD Transversal Filter, Proc. 1985 GaAS IC Symposium 27 (1985); (2) A cascade of GaAs sample/holds as a tapped delay line and an array of fixed capacitors for tap weighting, several capacitor arrays are included on a single chip to switch between lowpass, highpass, and bandpass responses; see, A. McKnight et al, High Frequency GaAs Transversal Filter, 20 Elec. Lett. 84 (1984); (3) A separate SAW delay line for each bit of tap weight programming accuracy; see, J. Lattanza et al, Programmable RF Signal Processors Demonstrated for Spread-Spectrum Communications Systems, Microwave System News 76–92 (April 1985); (4) A GaAs combined FET and acoustic device which takes advantage of the piezoelectric modulation of MESFET depletion regions by an acoustic wave; see, S. Merritt et al, GaAs SAW/MESFET Programmable Tapped Delay Line, Proc. 1984 IEEE Ultrasonics Symp. 308; and (5) An acoustic charge transport device; see, M. Hoskins et al, Buried Channel Acoustic Charge Transport Devices in GaAs, Proc. 1983 GaAs IC Symp. 96.

Poor tap weight control range and poor dynamic range have severely impaired performance of all PTFs reported to date. Tap weight control range limits filter sidelobe performance. Low dynamic ranges nullifies all the advantages of even the best sidelobe performance.

SUMMARY OF THE INVENTION

The present invention provides a hybrid programmable transversal filter (PTF) with a LiNbO$_3$ SAW device tapped by arrays of dual-gate MESFETs formed monolithically in GaAs. Preferred embodiments with sixteen taps have demonstrated 70 dB of tap weight control range. Single tap insertion loss is only 26 dB over a 100 MHz bandwidth (40%) centered at 250 MHz. And dynamic range is 85 dB over the full 100 MHz bandwidth. This hybrid of LiNbO$_3$ SAW technology with dual-gate MESFET (DGFET) GaAs monolithic circuitry solves the problems of poor tap weight control range and poor dynamic range by combining a LiNbO$_3$ SAW device for low insertion loss and high dynamic range with monolithic GaAs DGFETs for high tap weight control range.

BRIEF DESCRIPTION OF THE DRAWINGS

The drawings are schematic for clarity.

DESCRIPTION OF THE PREFERRED EMBODIMENTS

Figure 1:
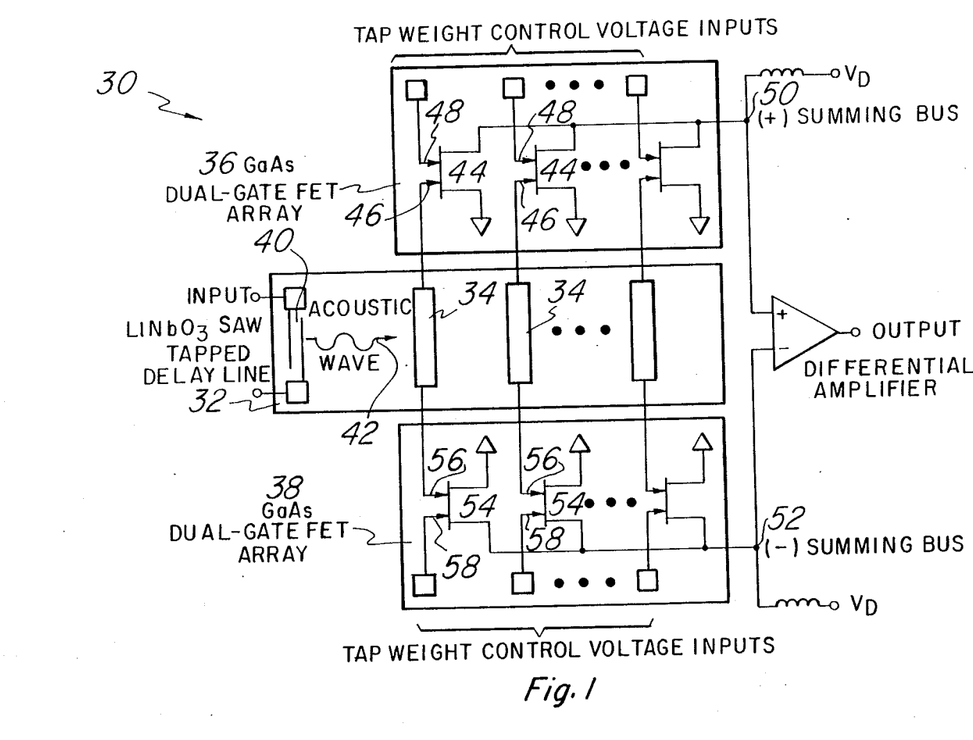
FIG. 1 is a schematic plan view of a first preferred embodiment programmable transversal filter.
Figure 2:
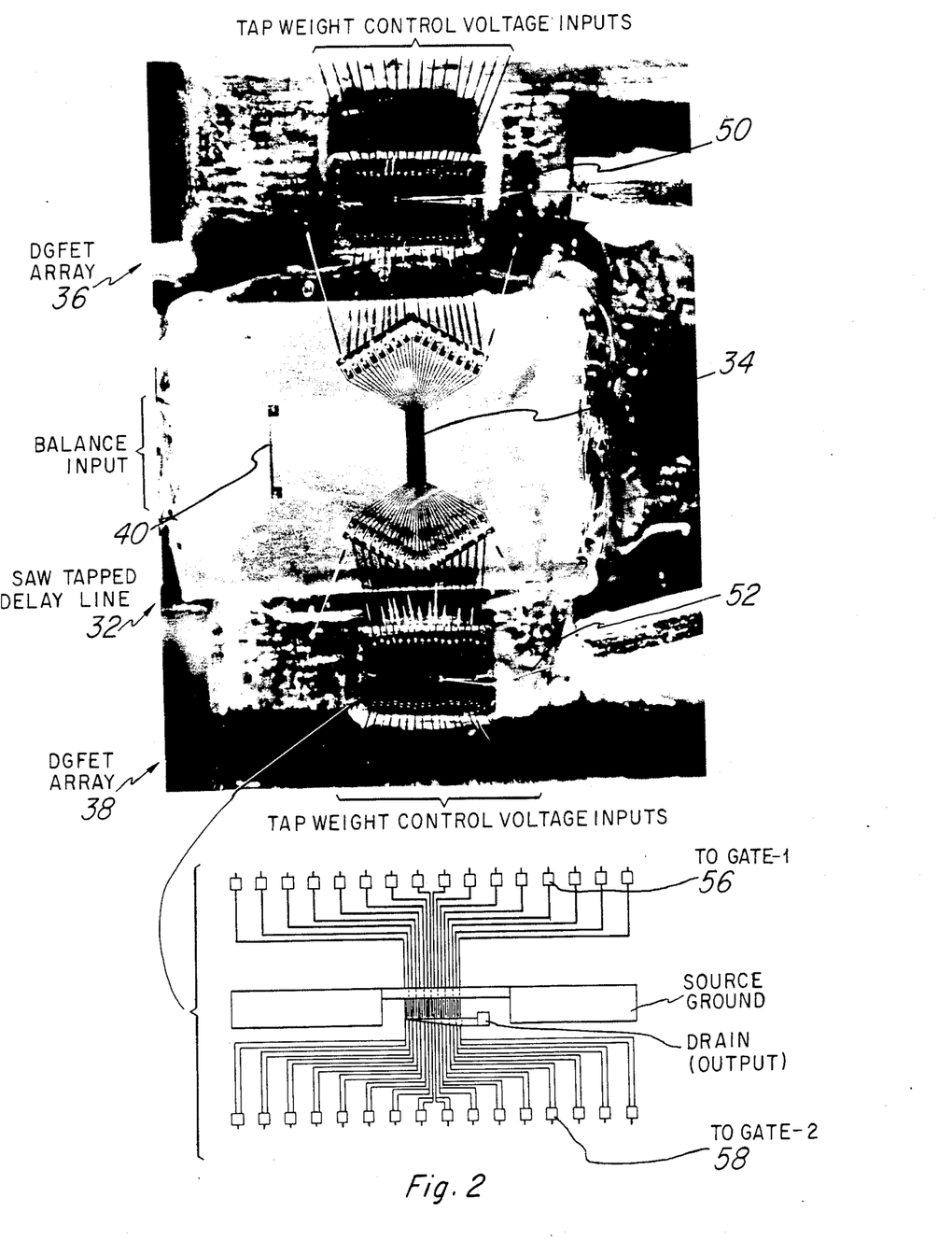
FIG. 2 is a photographic plan view of the first preferred embodiment.

A first preferred embodiment hybrid programmable transversal filter (PTF), generally denoted 30 and illustrated in schematic plan view in FIG. 1 and photographically in plan view in FIG. 2, includes a tapped SAW delay line 32 whose sixteen output electrodes 34 are connected to an array 36 of tap weight control dual-gate FETs 44. An input RF signal is applied to input transducer 40, which generates a surface acoustic wave 42 that propagates down the substrate. The array of sixteen output electrodes (transducers) 34 transform this acoustic wave 42 back into electrical signals that are delayed copies of the original input signal. Each output transducer 34 is connected to the input (gate-1 46) of a dual-gate FET (DGFET) tap weight control amplifier 44. The tap weight is controlled by gate-2 48 voltage. The DGFET outputs (drains) are connected to a common current summing bus 50. The PTF can now be identified by the process of shift, multiply and sum. Negative tap weights are generated with a second DGFET array 38 (DGFETs 54 with gate-1 56 connected to output transducer 34 and gate-2 58 voltage controlling the tap weight) whose outputs are connected to a common current summing bus 52 and inverted by an external differential amplifier. Initially, each gate-2 48 and gate-2 58 is biased to about −4.0 volts for a near-zero tap weight (see FIG. 4); a positive weight is produced by increasing the bias on gate-2 48, and a negative weight is produced by increasing the bias on gate-2 58. Summing the outputs of amplifiers 54 in bus 52 eliminates the need for an inverter at each tap.

The monolithic sixteen DGFETs 44 are shown in the insert of FIG. 2. 50 $\mu$m was chosen for the DGFET gatewidth as a trade off between dynamic range degradation (2 dB) and power dissipation (about 50 mW per tap); gate length is 1.5 $\mu$m. Two identical GaAs DGFET arrays (36 for positive and 38 for negative tap weights) are wire bonded to SAW device 32. Negative tap weights are generated by an external differential amplifier. The thirty-two gate-2 tap weight voltages are controlled by external D/As. Drain current for DGFETs 44 or 54 is supplied through an RF choke; no output matching is necessary.

FIG. 2 is a photograph of PTF 30. A 250 MHz center frequency, three-wavelength-long interdigital transducer 40 on a LiNbO$_3$ chip launches the acoustic wave; a beamwidth of seventy-five lambda (about 1,000 microns) was chosen to facilitate matching. Transducer 40 is excited by a balanced hybrid through two matching inductors; the balanced drive minimizes electromagnetic coupling to the DGFET inputs.

The acoustic wave is detected by an array of sixteen quarter wavelength (at 200 MHz) active electrodes 34 interleaved with grounded electrodes (not illustrated in FIG. 1). Each electrode is aluminum about 3.5 microns wide by 1,000 microns long and the electrodes are spaced about 3.5 microns apart. Note that 3.5 microns is one quarter wavelength at 200 MHz; so $F_{samp}$ is 200 MHz. The active electrodes 34 fanout to bond pads on both sides of the chip. The fanout contributes about 300 fF of parasitic capacitance, which degrades dynamic range by about 3 dB.

PTF 30 can be fabricated by standard methods for LiNbO$_3$ SAW devices and GaAs FETs with wire bonding connections.

Figure 3:
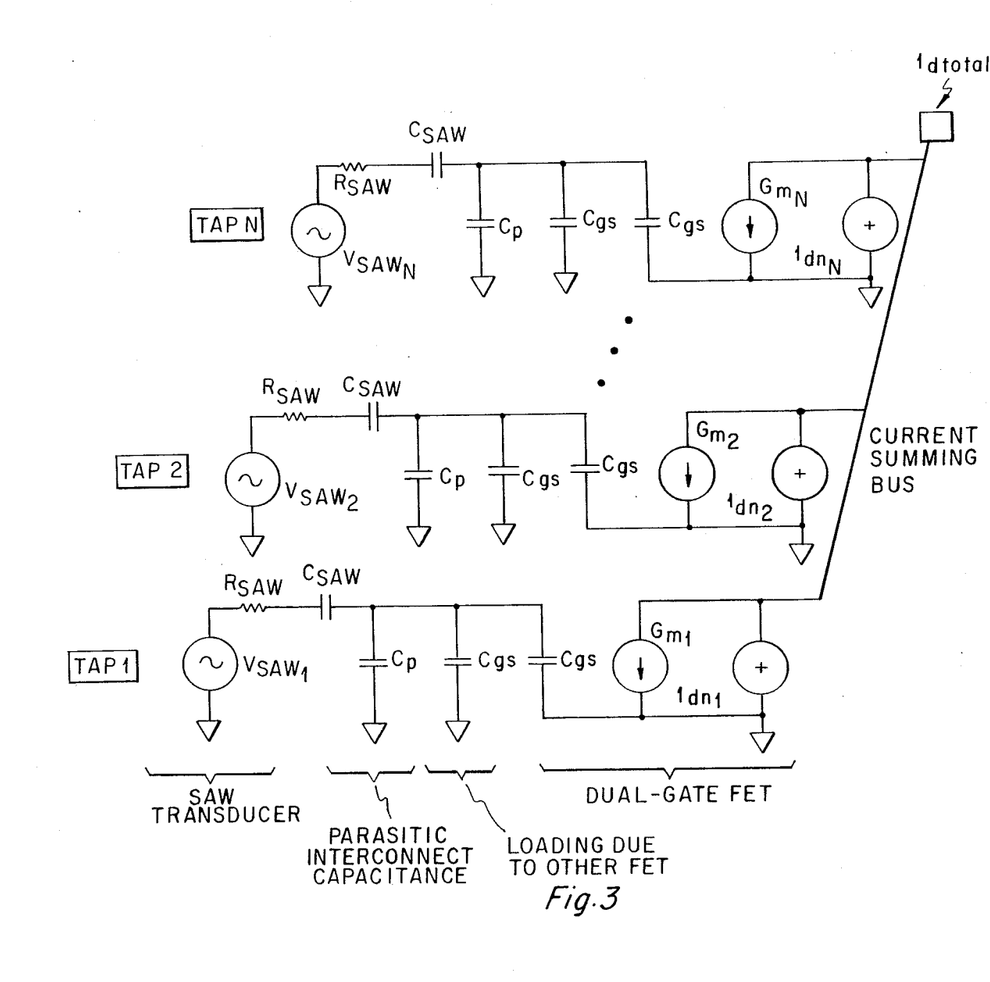
FIG. 3 is a schematic of a small-signal and noise model for the first preferred embodiment.

A simple DGFET small signal and noise model is needed to analyze tap weight control range and dynamic range; see FIG. 3 for such a model. Gain control is modeled by the variable transconductance ($G_m$) and is plotted in FIG. 4. DGFET noise is modeled with a white noise current source ($I_{dn}$) across the drain and source terminals. Normalized noise power ($I_{dn}/I_{dnmax}$)$^2$ is also plotted in FIG. 4. Notice that noise power decreases only slightly as gain is decreased. The input capacitance ($C_{gs}$) is independent of gain control; knowledge of the output impedance is not needed for this analysis.

Figure 4:
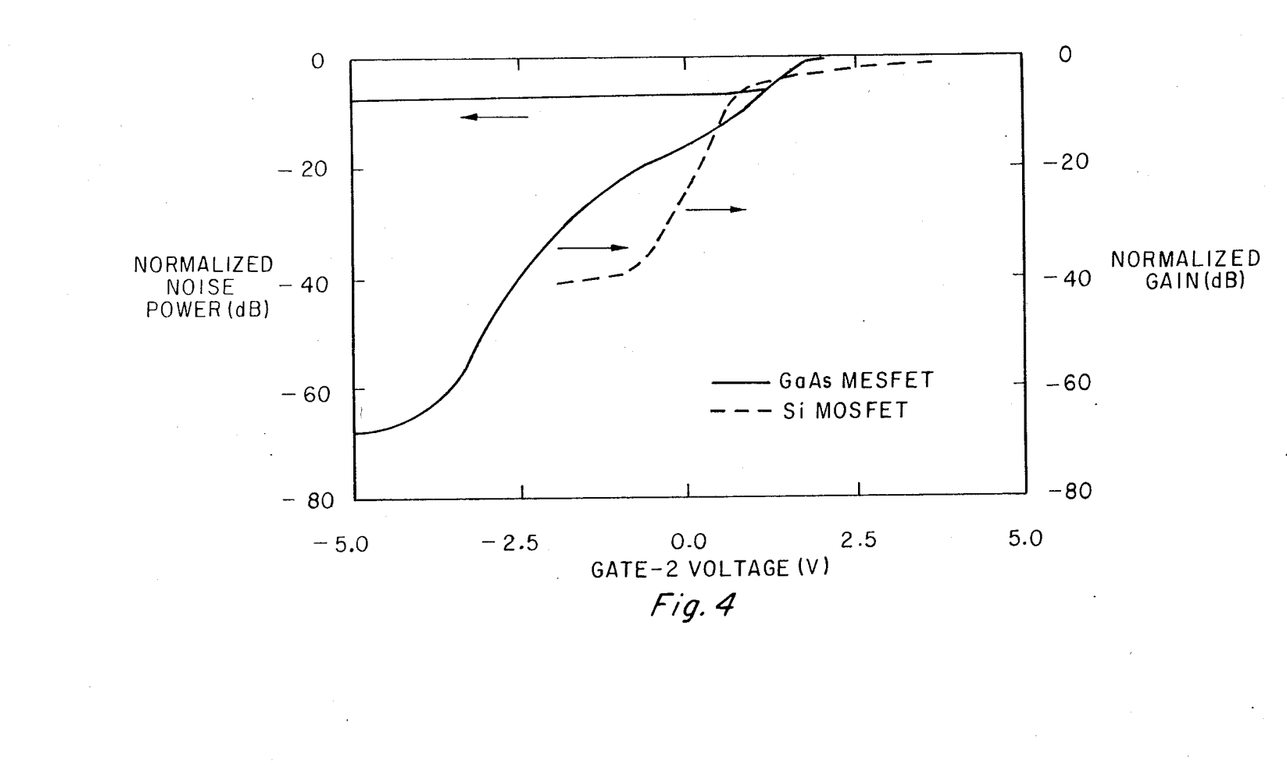
FIG. 4 shows the gain and noise of the tap amplifiers of the first preferred embodiment.

Tap weight control range is defined as the ratio between the tap amplifier maxmium and minimum gains. In FIG. 4 the GaAs DGFET is shown to have a 70 dB tap weight control range. Notice that a Silicon MOS DGFET has a tap weight control range of 40 dB, which far exceeds that of any other approach reported in the literature but even 40 dB tap weight control range is not sufficient.

Dyanamic range (DR) is defined as the maximum output power at which programmable transversal filter 30 can operate divided by the filter's output noise power. The maximum power is limited by the power that can be safely applied to the SAW input transducer 40 (about +20 dBm) and by insertion loss. The noise power is dominated by noise generated in the DGFETs.

Using the model shown in FIG. 3, the equation for dynamic range is calculated to be:

$$DR = DR_{max} \left( \begin{array}{c} SAW \text{ to } FET \\ \text{Matching} \\ \text{Loss} \end{array} \right)^{-1} \left( \frac{IL_{min}}{IL} \right) \left( \frac{P_{nmax}}{P_n} \right)$$

Figure 5:
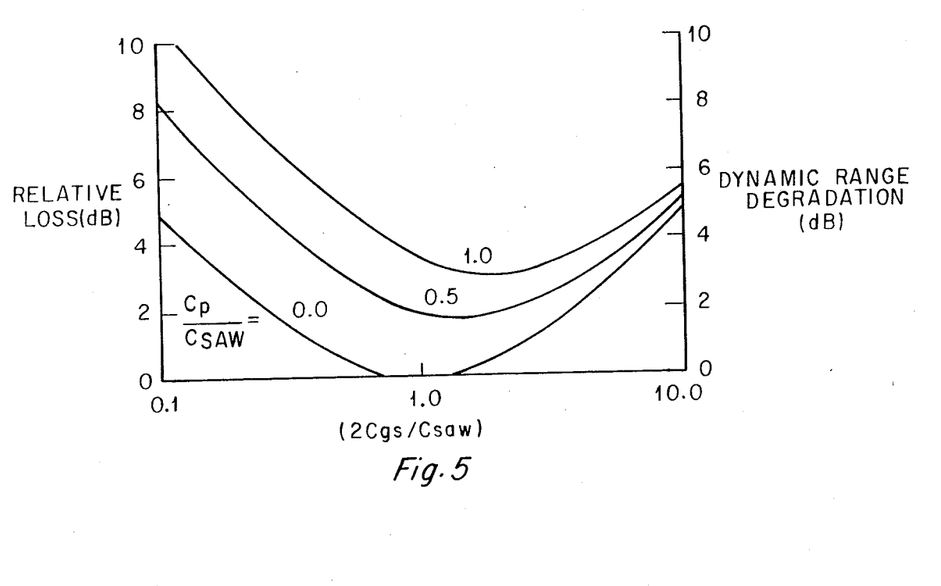
FIG. 5 illustrates the insertion loss and dynamic range degradation due to SAW-FET mismatch and parasitic interconnection capacitance in the first preferred embodiment.

The second term accounts for increased insertion loss due to non-ideal SAW-FET matching and due to parasitic interconnect capacitance. This term describes all dependence on FET gatewidth and SAW beamwidth (since FET input capacitance is proportional to gatewidth and SAW electrode capacitance is proportional to beamwidth). FIG. 5 is a plot of this matching term. Matching loss is minimized when $2C_{gs} = C_p + C_{saw}$. However, notice that a factor of five deviation from the optimum FET to SAW capacitance ratio results in less than 3 dB degradation in dynamic range. Furthermore, less than 4 dB degradation results for a parasitic interconnect capacitance ($C_p$) equal to $C_{saw}$.

Insertion loss IL increases when PTF 30 is programmed to a center frequency other than $F_{samp}$ because some of the required tap weights are less than unity and all taps are not in phase (third term in the equation for DR); output noise power $P_n$ decreases because of the tap weights that are less than unity (fourth term). However, insertion loss always increases faster than noise power decreases, as illustrated in FIG. 4. So, the third and fourth terms describe the degradation to dynamic range due to tap weight programming.

$DR_{max}$ is a constant that is independent of FET gatewidth, SAW beamwidth and PTF programming. $DR_{max}$ incorporates all of the material and process dependent parameters, and equals the dynamic range DR when:

(1) $G_{m[1 \ldots N]} = G_{mmax}$,
(2) $F = F_{samp}$ (all taps are in phase),
(3) $C_{saw} = 2C_{gs}$ (optimum FET-SAW matching), and
(4) $C_p = 0$ (no parasitic capacitance).

In fact, $$DR_{max} = \left( \frac{N}{4F \times BW} \right) \left( \frac{F_t G_{mmax}}{I_{dnmax}^2} \right) \left( \frac{P_{inmax}}{Q_{saw} IL_{in}} \right)$$

where the second term on the right is the FET material dependence and the third term is the SAW material dependence and:

BW = total device bandwidth (for noise calculation);
$G_{mmax}$ = transconductance at maximum gain setting;
F = signal frequency;
$F_t$ = frequency at which FET current gain becomes unity ($G_{mmax}/(2\pi C_{gs})$);
$I_{dnmax}$ = FET output noise current at maximum gain setting;
$IL_{in}$ = insertion loss of input transducer (when matched to cover the full bandwidth);
N = number of taps;
$P_{inmax}$ = maximum operating power of SAW input transducer (+20 dBM); and
$Q_{saw}$ = output transducer Q ($R_{saw} C_{saw} \omega$).

Several monolithic GaAs approaches may be considered. GaAs has a very low piezoelectric coupling coefficient (very large $Q_{saw}$). Signal level on the output transducer is proportional to this coupling coefficient. $Q_{saw}$ accounts for this effect in the $DR_{max}$ equation. Since the low copling coefficient also results in very high input transducer Q, large mismatch loss must be accepted on the input transducer to achieve the 100 MHz bandwidth. An edge bonded input transducer improves insertion loss ($IL_{in}$) and $DR_{max}$ by 8 dB. A thin (0.04 wavelength) ZnO film on the GaAs surface under the input transducer increases the coupling coefficient, which improves $IL_{in}$ and dynamic range by 13 dB. However, monolithic GaAs approaches are still much inferior to the approach of PTF 30. The GaAs FET/LiNbO3 combination exhibits the highest dynamic range due to the high piezoelectric coupling SAW substrate and the high $F_t$ of its FETs. A Silicon FET version exhibits a 10 dB lower $DR_{max}$ due to the lower $F_t$ of its MOSFETs. Indeed, the high piezoelectric coupling coefficient of LiNbO3 is important for both the input and output transducers (40 and 34); high coupling results in low input transducer Q, which means the input can be matched over a broad bandwidth (~40%) without much mismatch loss. The higher coupling also results in a larger voltage on the output electrodes 34 for a given incident acoustic power. Both of these effects translate into lower insertion loss and hence higher dynamic range.

GaAs has about a six times higher electron mobility than silicon; as a result, a GaAs DGFET is about six times smaller than a silicon DGFET with the same DC characteristics and thus parasitic capacitances are six times smaller, or, alternatively, with the same parasitic capacitance a GaAs DGFET has about six times the transconductance and gain of a silicon DGFET. This higher gain yields higher dynamic range, and reduced capacitances result in higher tap weight control range at RF frequencies (maximum gain is proportional to transconductance and minimum gain is limited by parasitic capacitances).

Ideally, dynamic range equals $DR_{max}$ when all taps are programmd to unity. DR is degraded by parasitic interconnect capacitance ($C_p$) and non-ideal SAW to FET matching in the experimental hybrid versions. Ideally, DR decreases by 16 dB when only one tap is on (24 dB gain decrease, 6 dB noise decrease, 2 dB $DR_{max}$ increase).

Figure 6:
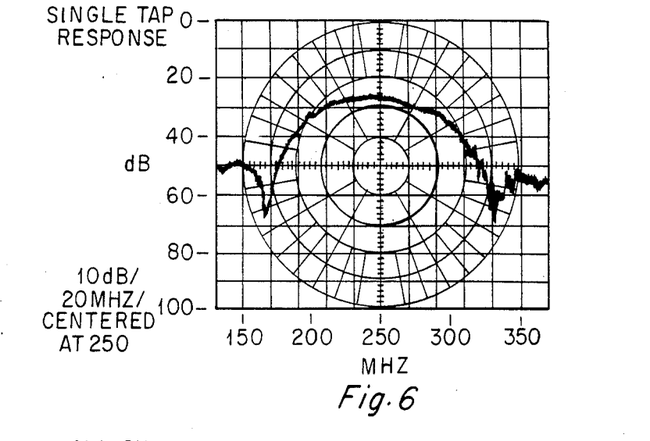
FIGS. 6–8 show various frequency responses of the first preferred embodiment.
Figure 7:
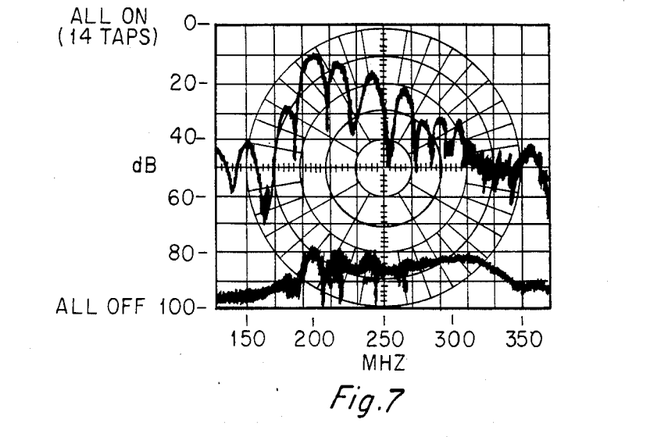
Figure 8:
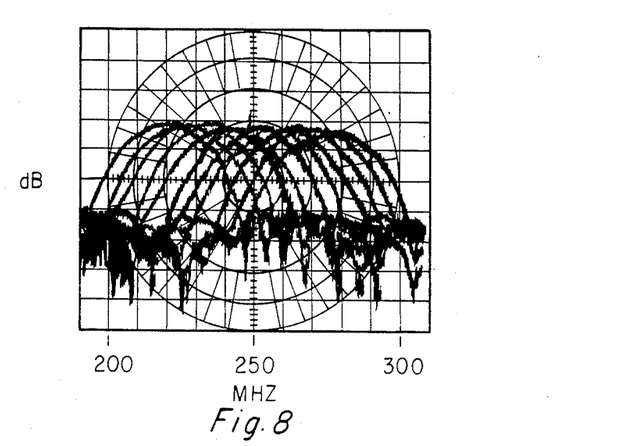

FIG. 6 is a photograph of the single tap response of PTF 30. Mid-band insertion loss is 26 dB (theory 28 dB). FIG. 7 is a photograph of the response with all taps on. Insertion loss is 10 dB at 200 MHz (theory predicts 7 dB). The response with all taps of is also shown in FIG. 7. All 16 DGFETs contribute equally to the response when all taps are off. So the response should have the same shape as the response with all taps on, and the difference in gain is the tap weight control range. FIG. 7 shows the tap weight control range to be 70 dB. FIG. 8 is a composite of eleven Hamming weighted bandpass responses which illustrates the center frequency programmability of PTF 30; the curves in FIG. 8 correspond to center frequencies at every 5 MHz from 225 MHz to 275 MHz.

Dynamic range is the ratio of maximum output signal power to output noise power. Maximum output signal power is limited by insertion loss and the power that can be applied to the input transducer (+20 dBm). Noise power for PTF 30 was measured using a precision noise figure meter. With one tap on, noise power was 10.5 dB above kT across the full 100 MHz bandwidth (theory predicts 4.5 dB). And with all taps on, noise power was 19 dB above kT (theory predicts 10.5 dB). Dynamic range is 77 dB with one tap on. Our theory predicts 81 dB. The theory is 2 dB high in insertion loss and 6 dB low in noise power. Dynamic range is 85 dB with all taps on. Our theory predicts 97 dB for this case. The theory is 3 dB low in insertion loss and 9 dB low in noise power.

MODIFICATIONS AND ADVANTAGES

Various modifications of the preferred embodiment devices and methods may be made while retaining the feature of a hybrid filter with LiNbO$_3$ SAW device coupled to gallium arsenide dual gate FET arrays of tap weight control amplifiers. For example, the dimensions and shapes of the tapped delay line and monolithic DGFET arrays can be varied; 128 or other numbers of electrodes on the SAW device could be used; center frequencies other than 250 MHz can be used; and the differential amplifier could be replaced by a 180 degree combiner or other output.

What is claimed is:

1. An electronic signal processor, comprising:
   (a) a LiNbO$_3$ surface acoustic wave (SAW) device including a broadband input transducer and N active electrodes, each of said electrodes elongated and located in the path of acoustic signals generated by said input transducer;
   (b) 2N GaAs dual-gate MESFETs, the first gate of the $j^{th}$ MESFET connected to a first end of the $j^{th}$ electrode and the first gate of the $(N+j)^{th}$ MESFET connected to the other end of the $j^{th}$ electrode, and the second gates of said MESFETs connected to weight control voltages;
   (c) a signal input connected to said input transducer; and
   (d) an output differential amplifier or 180 degree combiner with the outputs of the first N of said MESFETs summed and connected to a first input of said amplifier or combiner and the outputs of the second N of said MESFETs summed and connected to the other input of said amplifier or combiner.

2. The processor of claim 1, wherein:
   (a) said first N MESFETs are monolithically integrated on a GaAs substrate; and
   (b) said second N MESFETs are monolithically integrated on a GaAs substrate.

3. The processor of claim 2, wherein:
   (a) said signal input is balanced.

4. The processor of claim 2, wherein:
   (a) the ratio of the acoustic beamwidth of said input transducer to the gate width of said MESFETs makes twice the first gate-source capacitance roughly equal to the electrode-to-ground capacitance plus parasitic electrode-to-gate-interconnection capacitance.

* * * * *